(12) United States Patent
Cho et al.

(10) Patent No.: US 9,718,251 B2
(45) Date of Patent: Aug. 1, 2017

(54) LAMINATE HAVING POROUS ORGANIC SEMICODUCTOR THIN FILM AND CHEMICAL SENSOR COMPRISING SAME

(71) Applicant: CENTER FOR ADVANCED SOFT ELECTRONICS, Pohang-si, Gyeongsangbuk-do (KR)

(72) Inventors: Kilwon Cho, Pohang-si (KR); Joon Hak Oh, Ulsan (KR); Boseok Kang, Gangwon-do (KR); Moonjeong Jang, Changwon-si (KR); Yoonyoung Chung, Seoul (KR); Haena Kim, Siheung-si (KR); Sang Kyu Kwak, Ulsan (KR)

(73) Assignee: CENTER FOR ADVANCE SOFT ELECTRONICS, Pohang (KR)

( * ) Notice: Subject to any disclaimer, the term of this patent is extended or adjusted under 35 U.S.C. 154(b) by 0 days.

(21) Appl. No.: 14/826,883

(22) Filed: Aug. 14, 2015

(65) Prior Publication Data

US 2016/0254463 A1  Sep. 1, 2016

(30) Foreign Application Priority Data

Feb. 26, 2015 (KR) .......................... 10-2015-0027174

(51) Int. Cl.
*H01L 51/00* (2006.01)
*G01N 27/414* (2006.01)
(Continued)

(52) U.S. Cl.
CPC ................. *B32B 3/26* (2013.01); *B32B 5/16* (2013.01); *B32B 27/14* (2013.01);
(Continued)

(58) Field of Classification Search
CPC ..... H01L 51/0094; G01N 27/414; B32B 3/26; B32B 5/16; B32B 2264/0214
See application file for complete search history.

(56) References Cited

U.S. PATENT DOCUMENTS

| 2006/0214154 A1* | 9/2006 | Yang ..................... H01L 51/052 257/40 |
| 2010/0244000 A1* | 9/2010 | Tanaka ................ H01L 51/0074 257/40 |

FOREIGN PATENT DOCUMENTS

| JP | 2006-005330 A | 5/2005 |
| KR | 1020080066152 A | 7/2008 |

OTHER PUBLICATIONS

Lee et al., "Control of Mesoscale and Nanoscale Ordering of Organic Semiconductors At the Gate Dielectric/Semiconductor Interface for Organic Transistors," J. Mater. Chem. 2010 20 2549-2561.*

(Continued)

*Primary Examiner* — Hai Vo
(74) *Attorney, Agent, or Firm* — STIP Law Group, LLC

(57) ABSTRACT

Disclosed herein is a laminate comprising: a substrate; an organic surface modifying layer disposed on the substrate; and a porous organic semiconductor layer disposed on the surface modifying layer. Onto the substrate, introduction of the organic surface modifying layer having a low surface energy, and optionally the organic intermediate layer having a low glass transition temperature controls the self assembly of the organic semiconductor layer, allowing the porous organic semiconductor layer to have high crystallinity and large crystal grains. Also, provided is a highly efficient chemical sensor comprising the laminate.

13 Claims, 9 Drawing Sheets

(51) Int. Cl.
  B32B 3/26      (2006.01)
  H01L 51/05     (2006.01)
  B32B 5/16      (2006.01)
  B32B 27/14     (2006.01)
(52) U.S. Cl.
  CPC .. *H01L 51/0558* (2013.01); *B32B 2264/0214* (2013.01); *B32B 2307/202* (2013.01); *H01L 51/0055* (2013.01)

(56) References Cited

OTHER PUBLICATIONS

'Polystyrene Wikipedia', [retrieved on Aug. 29, 2016]. Retrieved from the Internet: <URL: https://en.wikipedia.org/wiki/Polystyrene>.*

Oh et al., "Properties of Organic Thin-Film Transistors on Hybrid-Type Interlayer Dielectric Materials," Journal of the Korean Physical Society, vol. 49, No. 3, Sep. 2006, pp. 865-868.*

Kim et al., "Tunable Crystal Nanostructures of Pentacene Thin Films on Gate Dielectrics Possessing Surface-Order Control," Advanced Functional Materials, 2008, 18, 1363-1370.*

\* cited by examiner

LAMINATE HAVING POROUS ORGANIC SEMICODUCTOR THIN FILM AND CHEMICAL SENSOR COMPRISING SAME

The present application claims the priority benefit of Korean Application No. 10-2015-0027174, filed Feb. 26, 2015, which is hereby incorporated by reference.

BACKGROUND OF THE INVENTION

1. Field of the Invention

The present invention relates to a laminate having a porous organic semiconductor layer, and a chemical sensor comprising the same.

2. Description of the Related Art

An organic thin film transistor is a thin film transistor using an organic semiconductor, instead of inorganic (silicon) semiconductor, in its channel. There are no significant differences in overall structure between organic thin film transistors and silicon-based transistors. When a voltage is applied to the gate electrode, an electric field is generated in the semiconductor with an electric flow blocked by the insulating film, which leads to the semiconductor functioning as a field-effect transistor.

Turning to the operation principal of the device, applied voltage on the gate electrode controls the amount of charge carriers flowing between the source and the drain by forming a charge-free depletion layer or a charge-rich accumulation layer on the insulator/semiconductor interface. An on/off ratio, which is a current ratio taken when the device is operating relative to when the operation is stopped, is an important factor especially for applications of digital circuits in displays, such as computer monitors. Given an organic thin film transistor (OTFT) as a backplane, a display may have a bendable screen because OTFT allows for the use of a plastic plate as a screen substrate.

In spite of many years of extensive research into organic thin film transistors, the commercialization of organic thin film transistors has not yet been realized. Many companies that focused their competence on the development of OTFTs, such as ORFID, Motorola, Seiko Epson, Printed-Systems GmbH, PolymerVision, etc., have gone bankrupt, or have shifted to other fields. They seemed to have determined that OTFTs would not survive competition with LIPS (Low-temperature poly silicon) or oxide semiconductors (ZnO, CuO, $Fe_2O_3$, etc.) due to the low charge mobility and instability of organic semiconductors.

In recent years, however, the advent of high-performance small- or large-molecule materials for organic semiconductors has changed the situation and now prospects seem optimistic. Accordingly, synthesis techniques to maximize the performance of developed materials and device techniques for self assembly and performance are in demand. Particularly, deposition and solution processes for the fabrication of ultra thin films as thin as a single crystal are important material techniques to elicit maximum electrical performance from the materials, and are often introduced in the world's top journals.

Among the main barriers to the commercialization of organic thin film transistors are low crystallinity, poor quality such as unfavorable molecular arrangement, and relatively low mobility attributable to organic thin films. As a rule, the semiconductor-insulator interface has a great influence on the performance of the thin film transistor. Particularly for a bottom-gate transistor, surface properties of an insulator thin film play a critical role in controlling the growth and morphology of the semiconductor layer.

In addition to fundamentally having a switching function, such an organic thin film transistor may be utilized applied as a sensor device. On the whole, transistor-type sensors exhibit good sensitivity thanks to the application function that transistors fundamentally have. For transistor-type chemical sensors, a significant signal change cannot be brought about without the diffusion of analyte molecules to the transistor channels. However, because it is difficult for analyte molecules to pass through the semiconductor layer in conventional transistor-type chemical sensors of a bottom-gate structure, the sensors encounter the problem of low sensitivity and slow response rate.

In order to improve the sensitivity and response rate, crystal grains of semiconductor thin films are minimized to provide an intergrain path necessary for molecular diffusion whereby analyte molecules can readily pass through the organic semiconductor films. This strategy, however, reaches the impasses that the small crystal grain size of the organic semiconductor thin films and the intergrain pores do not guarantee sufficient electrical properties to the sensor function.

SUMMARY OF THE INVENTION

It is an object of the present invention to provide a laminate in which an organic surface modifying layer with a low surface energy is introduced onto a substrate and is covered with a porous organic semiconductor layer.

It is another object of the present invention to provide a laminate in which an organic intermediate layer with a low glass transition temperature is formed on an organic surface modifying layer, and is covered with a porous organic semiconductor layer having high crystallinity and large crystal grains.

It is a further object of the present invention to provide a chemical sensor using the laminate, which is superior to conventional chemical sensors in terms of electrical property, sensitivity, reliability, and efficiency.

In accordance with an aspect thereof, the present invention provides a laminate, comprising: a substrate; an organic surface modifying layer disposed on the substrate; and a porous organic semiconductor layer disposed on the surface modifying layer.

In one exemplary embodiment, the organic surface modifying layer may have a surface energy of 10 to 60 mJ m$^{-2}$.

In another exemplary embodiment, the porous organic semiconductor layer may range in pore size from 1 to 2000 nm.

In another exemplary embodiment, the organic surface modifying layer may be a self-assembled monolayer (SAM).

In another exemplary embodiment, the organic surface modifying layer may contain any one of the compounds represented by the following Chemical Formulas 1 and 2:

[Chemical Formula 1]

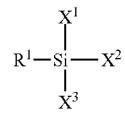

wherein,
$R^1$ is a C3 to C30 alkyl,
$X^1$ is a C1 to C6 alkoxy, F, Cl, Br, or I,
$X^2$ is H, a C1 to C6 alkoxy, F, Cl, Br, or I, and
$X^3$ is H, a C1 to C6 alkoxy, F, Cl, Br, or I; and

[Chemical Formula 2]

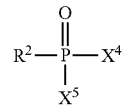

wherein,
$R^2$ is a C3 to C30 alkyl,
$X^4$ is H, OH, or a C1 to C6 alkoxy, and
$X^5$ is H, OH, or a C1 to C6 alkoxy.

In another exemplary embodiment, the organic surface modifying layer may contain a compound selected from the group consisting of n-octadecyltrimethoxysilane, n-octadecyltrichlorosilane, n-octyltrimethoxysilane, n-octyltrichlorosilane, n-octadecylphosphate, and n-octylphosphate.

In another exemplary embodiment, the laminate may further comprise an organic intermediate layer between the organic surface modifying layer and the organic semiconductor layer.

In another exemplary embodiment, the organic intermediate layer contains a low-molecular weight material having a glass transition temperature ($T_g$).

In another exemplary embodiment, the glass transition temperature ranges from 0 to 300° C.

In another exemplary embodiment, the low-molecular weight material is any one of compounds represented by the Chemical Formula 3 or 4:

[Chemical Formula 3]

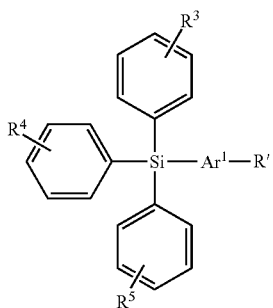

wherein, $Ar^1$ is a C6 to C22 polycyclic aromatic hydrocarbon radical, or

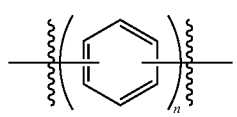

wherein n is an integer of 1 to 5,

R' is H, or

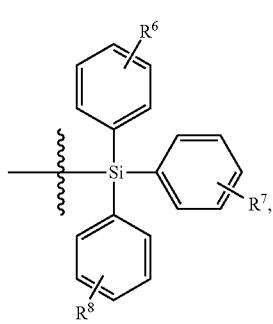

$R^3$ to $R^5$, which may be the same or different, are independently H or a C1 to C6 alkyl, $R^6$ to $R^8$, which may be the same or different, are independently H or a C1 to C6 alkyl;

[Chemical Formula 4]

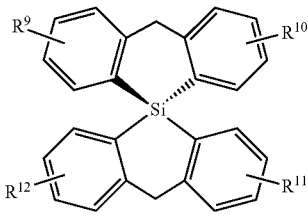

wherein, $R^9$ to $R^{12}$, which may be the same or different, are independently a hydrogen atom or a C1 to C6 alkyl.

In another exemplary embodiment, $Ar^1$ of Chemical Formula 3 is selected from among phenylene, naphthalenylene, anthracenylene, pyrenylenylene, tetracenylene, and pentacenylene.

In another exemplary embodiment, the low-molecular weight material is selected from among m-bis(triphenylsilyl)benzene, o-bis(triphenylsilyl)benzene), and p-bis(triphenylsilyl)benzene.

In another exemplary embodiment, the organic semiconductor layer contains at least one selected from among oligo-thiophene, polycyclic aromatic hydrocarbon compounds, polycyclic heteroaromatic hydrocarbon compounds, and derivatives thereof.

In another exemplary embodiment, the organic semiconductor layer contains at least one selected from among anthracene, tetracene, pentacene, hexacene, quinolone, naphthylridine, quinazoline, antradithophene, fullerene, perylenedicarboximide, naphtalene diimide, oligo-thiophene, 6,13-bis(triisopropylsilylethynyl)pentacene, 5,11-bis(triethylsilylethynyl)anthradithiophene, 2,8-difluoro-5,11-bis(triethylsilylethynyl)anthradithiophene, C60 PCBM, Cu-phthalocyanine), and Zn-phthalocyanine.

In accordance with another aspect thereof, the present invention provides a method for fabricating a laminate, comprising: preparing a substrate (step a); forming an organic surface modifying layer on the substrate (step b); and forming a porous organic semiconductor layer on the organic surface modifying layer (step c).

In one exemplary embodiment, the method further comprises, after step b, forming an organic intermediate layer on the organic surface modifying layer (step b').

In another exemplary embodiment, step c may be carried out at a temperature higher than the glass transition temperature ($T_g$) of the organic intermediate layer.

In another exemplary embodiment, the temperature may be higher than the glass transition temperature by 0.1 to 100° C.

In accordance with a further aspect thereof, the present invention provides an electronic device, comprising the laminate.

In accordance with a still further aspect thereof, the present invention provides a transistor, comprising: a substrate; an organic surface modifying layer disposed on the substrate; a porous organic semiconductor layer disposed on the organic surface modifying layer; and a source electrode and a drain electrode disposed on the organic semiconductor layer.

In accordance with still another aspect thereof, the present invention provides a chemical sensor, comprising the transistor.

In accordance with yet another aspect thereof, the present invention provides a method for fabricating a transistor, comprising: preparing a substrate (step 1); forming an organic surface modifying layer on the substrate (step 2); forming a porous organic semiconductor layer on the organic surface modifying layer (step 3); and forming a source electrode and a drain electrode on the organic semiconductor layer.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
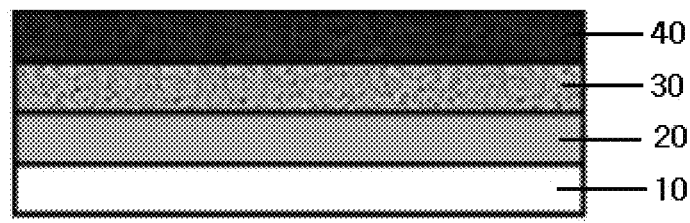
FIG. 1 is a lateral cross-sectional view showing the structure of a laminate comprising a low-molecular weight material low in glass transition temperature in accordance with the present invention.

Reference will now be made in detail to various embodiments of the present invention, specific examples of which are illustrated in the accompanying drawings and described below, since the embodiments of the present invention can be variously modified in many different forms. While the present invention will be described in conjunction with exemplary embodiments thereof, it is to be understood that the present description is not intended to limit the present invention to those exemplary embodiments. On the contrary, the present invention is intended to cover not only the exemplary embodiments, but also various alternatives, modifications, equivalents and other embodiments that may be included within the spirit and scope of the present invention as defined by the appended claims. However, in the following description of the invention, if the related known functions or specific instructions on configuring the gist of the present invention unnecessarily obscure the gist of the invention, the detailed description thereof will be omitted.

It will be understood that, although the terms first, second, etc. may be used herein to describe various elements, these elements should not be limited by these terms. These terms are only used to distinguish one element, from another element. For instance, a first element discussed below could be termed a second element without departing from the teachings of the present invention. Similarly, the second element could also be termed the first element. It will be understood that when an element is referred to as being "formed" or "deposited" on another element, it can be directly formed or deposited on a partial or overall surface of the other element or intervening elements may be present therebetween.

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Below, exemplary embodiments of the present invention will be explained in detail, and are provided to illustrate the present invention, but are not intended to limit the present invention. The present invention is defined only by the following claims.

As used herein the term "alkyl", unless otherwise defined, refers to a straight, branched, or cyclic aliphatic hydrocarbon. An alkyl may be a "saturated alkyl", which contains no double or triple bonds therein.

Alternatively, an alkyl may be an unsaturated alkyl that contains a double or triple bond.

An alkyl may be a C1 to C6 alkyl, and preferably a C1 to C3 alkyl.

For example, a C1 to C4 alkyl means an alkyl containing one to four carbon atoms. That is, a C1 to C4 alkyl may be selected from the group consisting of methyl, ethyl, propyl, isopropyl, n-butyl, iso-butyl, sec-butyl, and t-butyl.

Examples of the alkyl include methyl, ethyl, propyl, isopropyl, butyl, isobutyl, t-butyl, pentyl, hexyl, ethenyl, propenyl, butenyl, cyclopropyl, cyclobutyl, cyclopentyl, and cyclohexyl.

FIG. 1 is a lateral cross-sectional view showing the structure of a laminate of the present invention.

As can be seen, the laminate of the present invention may comprise a substrate 10, an organic surface modifying layer 20, and a porous organic semiconductor layer 40, and may further include an organic intermediate layer 30 between the organic surface modifying layer 20 and an organic semiconductor layer 40.

The substrate 10 may be made of a metal oxide, a semiconductor, glass, or plastic, and preferably may have an oxide layer (not shown) on its surface.

The oxide layer accounts for a predetermined thickness to which the substrate 10 is doped with oxygen. In this regard, the oxide layer may be formed at a thickness of 20 nm-300 nm.

Organic Surface Modifying Layer

The organic surface modifying layer 20 may be located between the substrate 10 and the porous organic semiconductor layer 40.

Preferably, the organic surface modifying layer 20 may have a low surface energy. More preferably, the surface energy of the organic surface modifying layer 20 is lower than that of the substrate 10. In detail, the organic surface modifying layer 20 may preferably have a surface energy of 10 to 60 mJ m$^2$, and more preferably 25 to 30 mJ m$^2$. The low surface energy of the organic surface modifying layer 20 allows the formation of the porous organic intermediate layer, inducing the organic intermediate layer 30 to behave suitably in dewetting.

In one exemplary embodiment of the present invention, the organic surface modifying layer may be a SAM (Self-Assembled Monolayer).

The organic surface modifying layer may contain a compound represented by the following Chemical Formula 1 or 2:

[Chemical Formula 1]

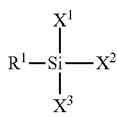

wherein,
$R^1$ is a C3 to C30 alkyl,
$X^1$ is a C1 to C6 alkoxy, F, Cl, Br, or I,
$X^2$ is H, a C1 to C6 alkoxy, F, Cl, Br, or I,
$X^3$ is H, a C1 to C6 alkoxy, F, Cl, Br, or I.

The compound represented by Chemical Formula 1 may preferably be n-octadecyltrimethoxysilane (OTS), n-octadecyltrichlorosilane, or n-octyltrichlorosilane.

[Chemical Formula 2]

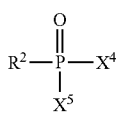

wherein,
$R^2$ is a C3 to C30 alkyl,
$X^4$ is H, OH, or a C1 to C6 alkoxy,
$X^5$ is H, OH, or a C1 to C6 alkoxy.

The compound represented by Chemical Formula 2 may preferably be n-octylphosphate, or n-octadecylphosphate.

Organic Intermediate Layer

The laminate may further comprise an organic intermediate layer 30 located between the organic surface modifying layer 20 and the porous organic semiconductor layer 40.

The organic intermediate layer is positioned on the organic surface modifying layer 20, and contains a low-molecular weight material with a low glass transition temperature ($T_g$).

The glass transition temperature may be 0° C. or higher, and range preferably from 0 to 300° C., more preferably from 0 to 200° C., and far more preferably from 0 to 150° C.

For example, a glass transition temperature of less than 0° C. is greatly different from the process temperature at which necessary processes should be conducted. On the other hand, when the glass transition temperature exceeds 300° C., the process temperature becomes too high to avoid the decomposition and degradation of the organic surface modifying layer 20, organic intermediate layer 30, and the organic semiconductor layer 40, and it is difficult to process a plastic substrate 10 at that temperature.

The low-molecular weight material may be a compound represented by the following Chemical Formula 3 or 4:

[Chemical Formula 3]

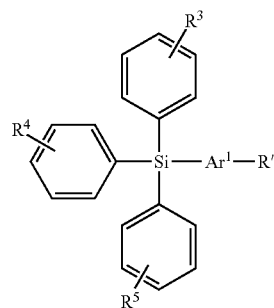

wherein,
$Ar^1$ is a C6 to C22 polycyclic aromatic hydrocarbon radical, or

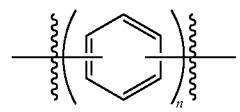

wherein n is an integer of 1 to 5,
R' is H, or

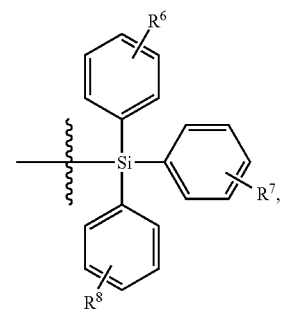

$R^3$ to $R^5$, which may be the same or different, are independently H, or a C1 to C6 alkyl, and
$R^6$ to $R^8$, which may be same or different, are independently H, or C1 to C6 alkyl.

Preferably, $Ar^1$ may be any one of phenylene, naphthalenylene, anthracenylene, pyrenylenylene, tetracenylene, and pentacenylene.

[Chemical Formula 4]

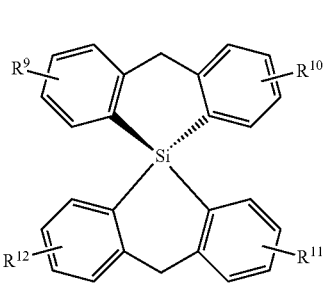

wherein,
$R^9$ to $R^{12}$, which may be the same or different, are independently a hydrogen atom, or a C1 to C6 alkyl.

In a preferred embodiment, the low-molecular weight material may be meta-, ortho- or para-isomers of the compound of Chemical Formula 3 wherein n is 1, which corresponds to bis(triphenylsilyl)benzene (TSB3). More preferred is m-bis(triphenylsilyl)benzene.

Organic Semiconductor Layer

The organic semiconductor layer 40 may be located on the organic surface modifying layer 20.

The organic semiconductor layer 40 is porous with a pore size of 1 to 2000 nm, preferably 10 to 500 nm, and more preferably 30 to 200 nm.

The organic semiconductor layer 40 may contain at least one selected from among oligo-thiophene, polycyclic aromatic hydrocarbon compounds, polycyclic heteroaromatic hydrocarbon compounds, and derivatives thereof.

Preferable examples of the material for the organic semiconductor layer 40 include anthracene, tetracene, pentacene, hexacene, quinolone, naphthylridine, quinazoline, antradithophene, fullerene, perylenedicarboximide, naphtalene diimide, oligo-thiophene, 6,13-bis(triisopropylsilylethynyl) pentacene, 5,11-bis(triethylsilylethynyl)anthradithiophene, 2,8-difluoro-5,11-bis(triethylsilylethynyl)anthradithiophene, C60 PCBM, Cu-phthalocyanine), and Zn-phthalocyanine.

Figure 2:
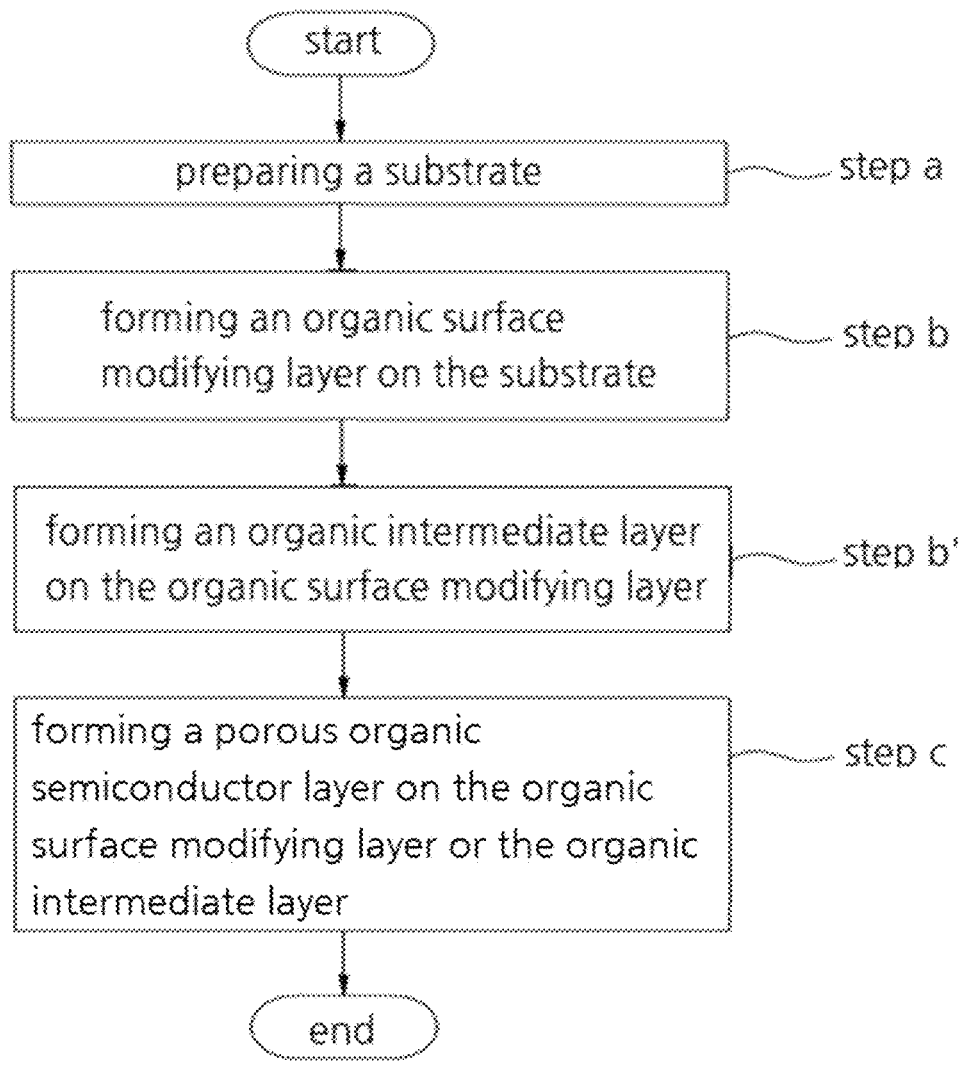
FIG. 2 is a flow chart illustrating a fabrication method of a laminate comprising a low-molecular weight material low in glass transition temperature in accordance with the present invention.

FIG. 2 is a flow chart illustrating a fabrication method of the laminate of the preset invention. With reference to FIG. 2, the fabrication of the laminate of the present invention will be explained, below.

First, a Substrate is Prepared (Step a).

The substrate may be made of a metal oxide, a semiconductor, glass, or a plastic, and preferably may have an oxide layer on its surface.

Following step a, an organic surface modifying layer is formed on the substrate (step b).

Preferably, the organic surface modifying layer may be a SAM (Self-Assembled Monolayer). As described above, the organic surface modifying layer may be formed of n-octadecyltrimethoxysilane (OTS). In this regard, the substrate may be coated with a solution of OTS in an organic solvent.

Next, a low-molecular weight material with a low glass transition temperature ($T_g$) may be selectively formed on the organic surface modifying layer (step b').

For this, step b' may be preferably conducted by forming the low-molecular weight material at a temperature higher than the glass transition temperature of the low-molecular weight material.

Subsequently, the organic surface modifying layer or the organic intermediate layer is covered with an organic semiconductor layer (step c).

Following step b or b', step c may be sequentially conducted in the same vacuum chamber. As in step b', the organic semiconductor layer is preferably formed at a temperature higher than the glass transition temperature of the low-molecular weight material.

The temperature at which steps b' and c are conducted is preferably set to maintain the organic intermediate layer in a rubbery phase so that a small number of crystal nuclei of the organic semiconductor are formed and then grow into crystals.

In detail, steps b' and c are preferably carried out at a temperature higher than the glass transition temperature of the low-molecular weight material by 0.1 to 100° C., preferably by 5 to 80° C., and more preferably by 10 to 50° C.

Further, the present invention addresses an electronic device comprising the laminate.

Figure 3:
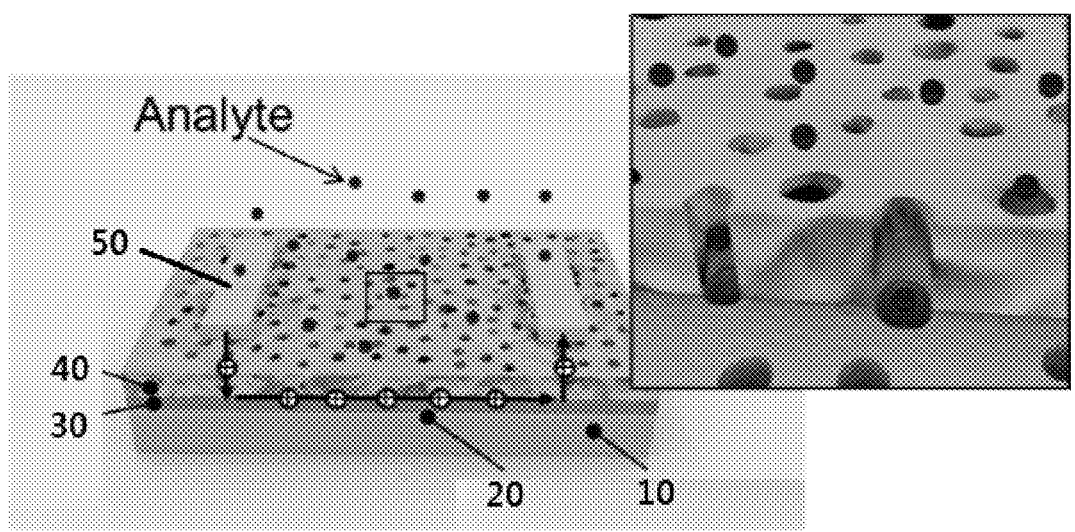
FIG. 3 is a view of a transistor structure comprising the laminate of the present invention.

FIG. 3 is a view of a transistor structure comprising the laminate of the present invention. Below, the transistor structure comprising the laminate of the present invention will be explained with reference to FIG. 3.

From the bottom, the transistor comprises a substrate 10, an organic surface modifying layer 20, an organic semiconductor layer 40, and an electrode 50. As the case may be, an organic intermediate layer 30 may be intercalated between the organic surface modifying layer 20 and the organic semiconductor layer 40.

Here, the substrate 10, the organic surface modifying layer 20, the organic intermediate layer 30, and the organic semiconductor layer 40 are as described in the laminate of the present invention, and thus the explanation thereof is omitted.

As can be seen, the electrode 50 is composed a source electrode and a drain electrode that are disposed at a distance from each other.

The source electrode and the drain electrode are independently formed of a metal selected from among Au, Al, Ag, Be, Bi, Co, Cu, Cr, Hf, In, Mn, Mo, Mg, Ni, Nb, Pb, Pd, Pt, Rh, Re, Ru, Sb, Ta, Te, Ti, V, W, Zr, Zn, and a combination thereof. When a combination of the metals is used for the electrode 50, the metals may be in an alloy or fused form.

Also, contemplated in accordance with an aspect of the present invention is a chemical sensor comprising the transistor.

Below, the fabrication of a transistor comprising the laminator of the present invention will be explained.

First, a substrate is prepared (step 1).

Following step 1, an organic surface modifying layer is formed on the substrate (step 2).

Next, an organic semiconductor layer is formed on the organic surface modifying layer is (step 3).

Steps 1 to 3 are the same as in steps a to c of the fabrication method of the laminate, and reference is made to the description of steps a to c.

Subsequently, a source electrode and a drain electrode are formed on the organic semiconductor layer (step 4).

Preferably, the electrodes are patterned with the aid of a mask by thermal deposition. Properties of the source and drain electrodes are as described in the laminate of the present invention, and the explanation thereof is omitted.

A better understanding of the present invention may be obtained through the following examples which are set forth to illustrate, but are not to be construed as limiting the present invention.

EXAMPLES

Example 1 (Fabrication of Laminate)

Figure 4:
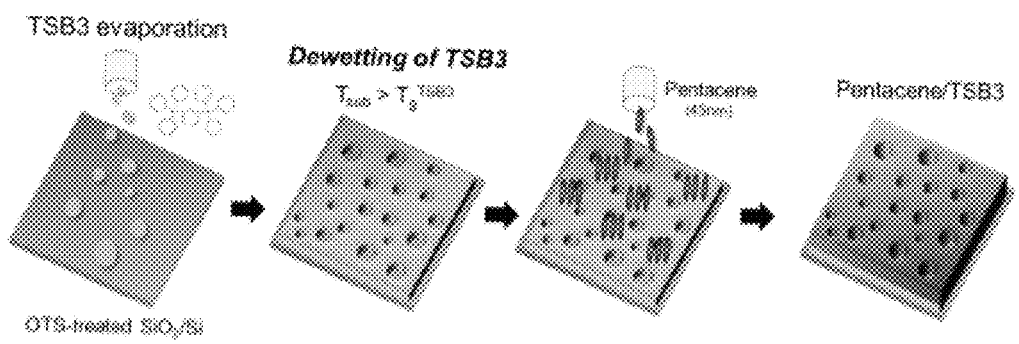
FIG. 4 schematically illustrates fabrication processes in accordance with Example 1.

Fabrication processes for a laminate are illustrated in schematic views of FIG. 4. With reference to FIG. 4, Example 1 is described in detail.

A doped $SiO_2$/Si wafer substrate in which $SiO_2$ (300 nm) was thermally grown was cleaned with a piranha solution (70 vol % $H_2SO_4$ and 30 vol % $H_2O_2$), and then UV-ozone treated.

On the $SiO_2$/Si wafer substrate, a 3 mM n-octadecyltrimethoxysilane (OTS) solution in trichloroethylene was applied by spin coating (3000 rpm, 30 sec) to form an OTS self-assembled monolayer (OTS-SAM). Next, the wafer substrate was placed overnight, together with several drops of $NH_4OH$, in a vacuum desiccator. Then, the wafer substrate was cleaned with toluene, acetone, and isopropyl alcohol, after which it was dried in a nitrogen atmosphere.

At 60° C., m-Bis(triphenylsilyl)benzene (TSB3) with a glass transition temperature of 33° C. was thermally deposited to form 15 nm-thick layer on the OTS-SAM/SiO$_2$/Si. While the vacuum chamber was not opened, but was maintained at 60° C., pentacene was deposited at a rate of 0.1 to 0.2 Å·s$^{-1}$ on the wafer to form an organic semiconductor layer 45 nm thick. For this, the pressure was maintained at 5.0×10$^{-6}$ torr or less. As a result, a laminate was completed.

Example 2 (Fabrication of Organic Transistor-Type Chemical Sensor)

After a laminate was fabricated in the same manner as in Example 1, Au was thermally deposited on the pentacene thin film through a patterned mask to form a source electrode and a drain electrode, both 40 nm thick with a channel length of 50 μm and a width of 1000 μm.

As a result, an organic transistor-type chemical sensor was obtained.

Example 3 (Fabrication of Laminate)

A laminate was fabricated in the same manner as in Example 1, with the exception that m-bis(triphenylsilyl) benzene (TSB3) was not deposited.

Example 4 (Fabrication of Organic Transistor-Type Chemical Sensor)

An organic transistor-type chemical sensor was fabricated in the same manner as in Example 2, with the exception that m-bis(triphenylsilyl)benzene (TSB3) was not deposited.

TEST EXAMPLES

Test Example 1: AFM Analysis

Figure 5:
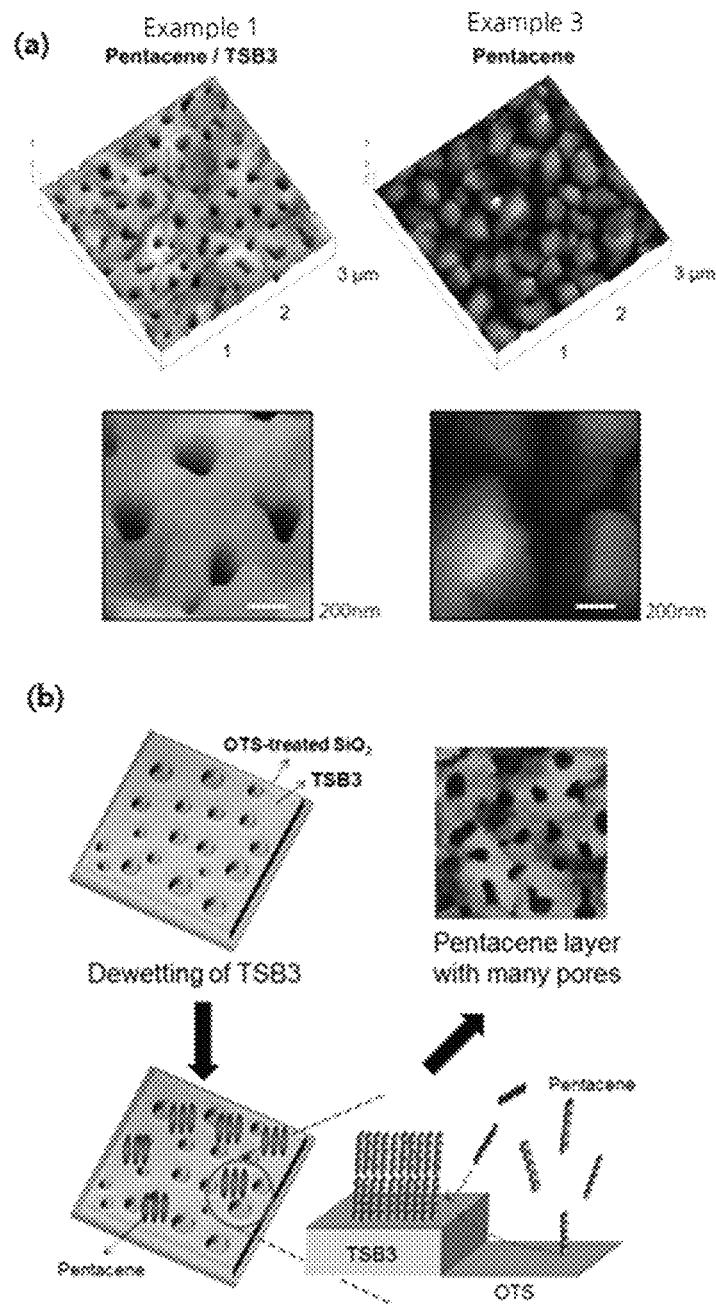
FIG. 5 shows AFM analysis results according to Test Example 1.

FIG. 5 shows AFM (Atomic Force Microscope) images of the laminates fabricated in Examples 1 and 3 (a), and schematic views of illustrating the growth mechanism of pentacene on TSB3 (b). The AMF was purchased from Digital Instruments Multimode.

As can be seen in FIG. 5*a*, the pentacene layer formed on the surface of the laminate of Example 1 had pores and exhibited crystallinity approximating a single crystal. In contrast, the laminate of Example 3 had a pentacene layer in which definite grain boundaries were formed, but without pores.

A theoretical elucidation may be made of the result as follows. In Example 1, the growth of pentacene was performed at 60° C., a temperature higher than the 33° C. glass transition temperature of TSB3, which was used for the organic intermediate layer. At 60° C., TSB3 exhibited a rubbery property, allowing a smaller number of growth nuclei to be formed for pentacene growth, compared to growth on a hard substrate. Accordingly, fewer grain boundaries were formed, resulting in an improvement in charge transfer.

On the contrary, the laminate of Example 3 was fabricated by growing pentacene on OTS, which is harder than TSB3, so that a larger number of growth nuclei are formed on OTS, compared to TSB3. Accordingly, more grain boundaries were formed, resulting in blocking charge transfer.

Turing to the mechanism illustrated in FIG. 5*b*, molecular dynamics simulation accounts for the direct contact of TSB3 with OTS in terms of the dewetting of TBS3. The interaction energy among TSB3 molecules is higher than that between TSB3 and OTS, implying that TSB3 is more prone to self-agglomeration, than covering the OTS layer. The smooth OTS layer with a low surface energy promotes the dewetting of TSB3, and may become rubbery because the process temperature is higher than the glass transition temperature ($T_g$) of TSB3. Pentacene, when deposited, is likely to be adsorbed onto the rubbery TSB3 rather than the dewetting OTS.

As a result, the growth of pentacene does not occur on the OTS region at all, thereby resulting in pore formation on the OTS region.

Test Example 2: DSC Analysis

In order to examine the glass transition temperature of m-bis(triphenylsilyl)benzene (TSB3) with a low-molecular weight, which was applied as a material of the organic intermediate layer in the laminate of Example 1, DSC (Differential scanning calorimetry) was performed (Perkin-Elmer DSC7). The result is depicted in FIG. 6.

Figure 6:
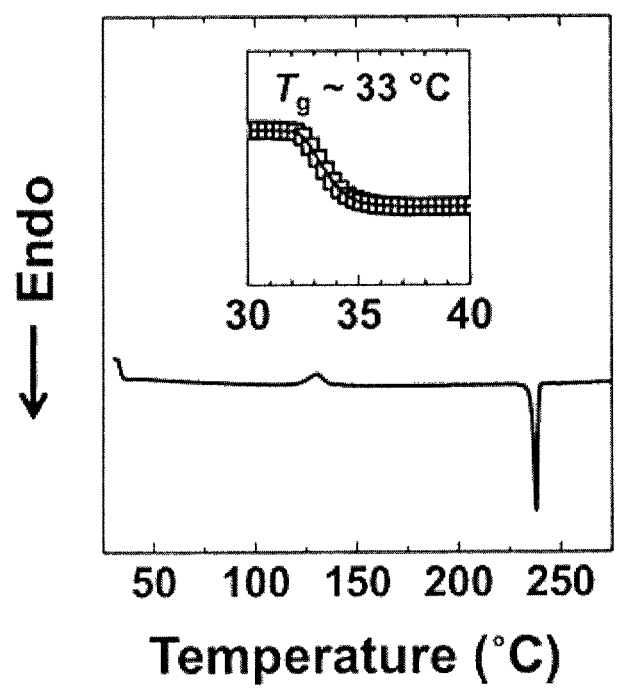
FIG. 6 shows DSC analysis results according to Test Example 2.

As can be seen in FIG. 6, an endothermic reaction was detected at 33° C., and then the DSC profile was constant, which indicated that the compound has a glass transition temperature ($T_g$) of 33° C. In addition, its melting point ($T_m$) was measured to be 238° C.

Test Example 3: SEM and HR-TEM Image

Figure 7:
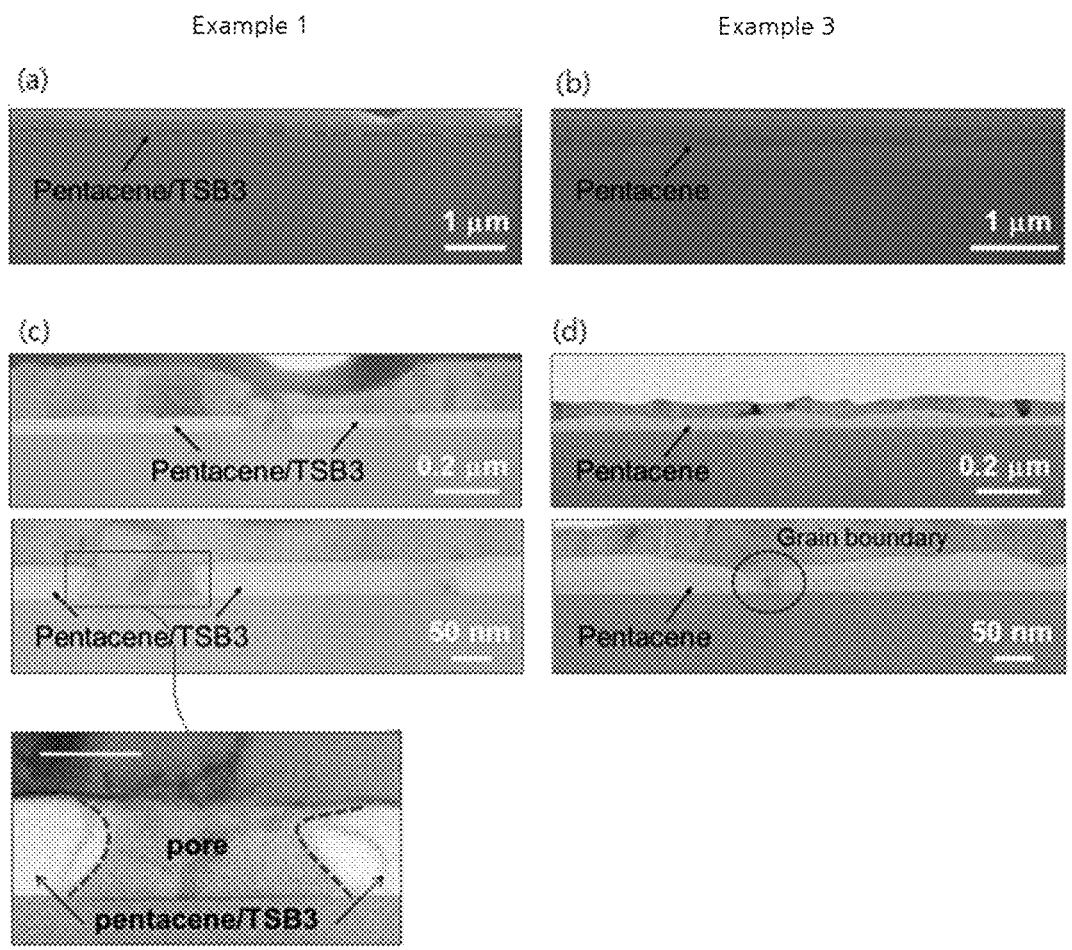
FIG. 7 shows SEM and HR-TEM images according to Test Example 3.

In FIG. 7, cross sections of the laminates of Examples 1 and 3 are given as SEM images (a, b) and HR-TEM images (c, d). SEM images were taken by Hitachi S-4200, while HR-TEM images were obtained from JEOL, JEM-2100F.

As shown in FIG. 7, the pentacene layer of the laminate of Example 1 had a smoother surface than did that of the laminate of Example 3, demonstrating that pentacene undergoes better plane growth on TSB3.

Referring to FIG. 7*c* and an enlarged view, pores were well defined in the laminate of Example 1.

Test Example 4: GIXD Analysis

Figure 8:
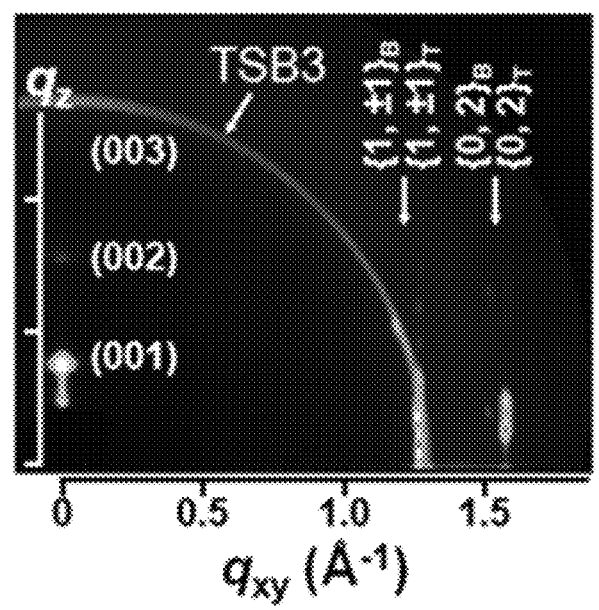
FIG. 8 shows GIXD analysis results according to Test Example 4.
Figure 8:
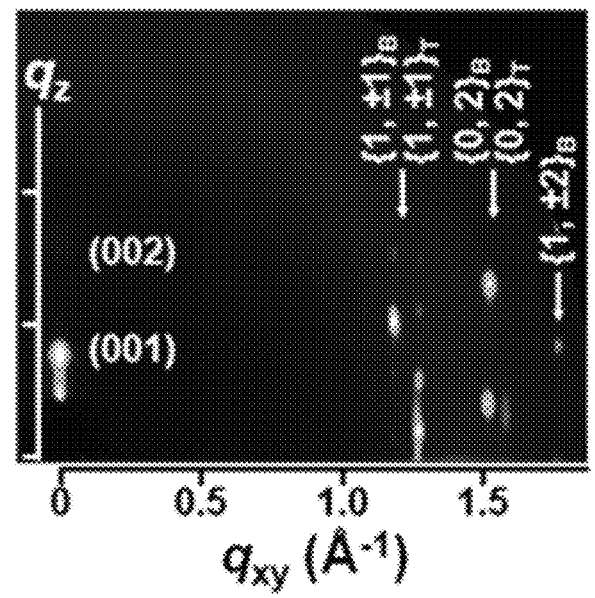

GIXD (Grazing-Incidence X-ray Diffraction) analysis was performed on the pentacene layers of the laminates fabricated in Examples 1 and 3, and the results are shown in FIG. 8. GIXD analysis was carried out under 3C and 9A beamline conditions.

As can be seen in FIG. 8, the pentacene layer of Example 3 had predominant bulk-phase peaks.

Test Example 5: Analysis for Performance of Organic Transistor-Type Chemical Sensor The organic transistor-type chemical sensors fabricated according to Examples 2 and 4 were compared for performance, and the results are given in FIG. 9.

Briefly, the performance analysis was carried out by measuring the methanol gas produced when a nitrogen gas was flowed into a flask filled with liquid methanol. The gasified methanol was introduced through a tube with a diameter of 3 mm into the chemical sensor of Example 2. The tube end was positioned at a site 5 cm higher than the surface of the chemical sensor. The methanol gas was allowed to flow at a constant rate of 4 sccm. The capacity of the gate dielectric was measured using Agilent 4284A, and the organic transistor-type chemical sensors of Examples 2 and 4 were both measured to have almost the same capacity, 11 nF cm$^{-2}$.

Figure 9:
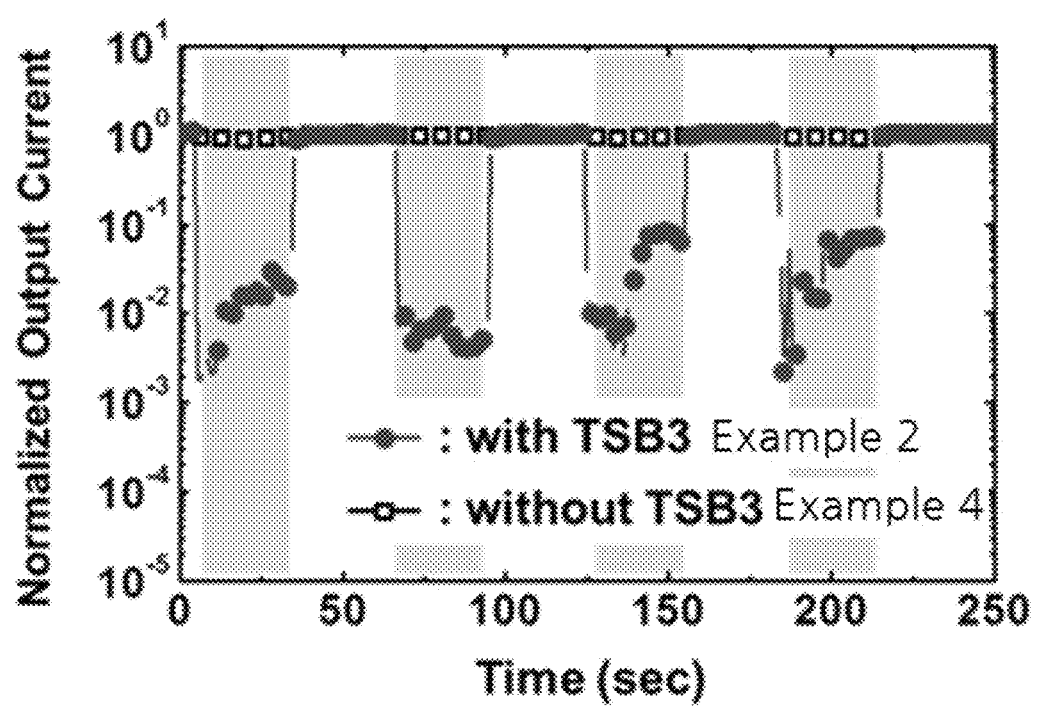
FIG. 9 shows performance analysis results of organic transistor devices according to Test Example 5.

FIG. 9 shows output currents of the chemical sensors with time. The bias stress effect was compensated for by discriminating data of the currents measured when analytes did not flow. The output current data were normalized to the initial current at t=0. The region in which the methanol gas (analyte) flowed is represented in a sky blue color. $V_{GS}$ (gate-source voltage) and $V_{DS}$ (drain-source voltage) were set to be −100 V.

Compared to the chemical sensor of Example 4, the organic transistor-type chemical sensor of Example 2 exhibited a significant reduction in output current upon exposure to methanol gas. In addition, it responded and was recovered within several seconds. These data demonstrate that the chemical sensor of Example 2 can respond remarkably faster and stably, compared to that of Example 4.

The high analysis performance of the organic transistor-type chemical sensor of Example 2 is believed to be attributed to the macroporous structure formed in the pentacene layer. That is, the analyte methanol gas could readily penetrate into the pentacene layer via the pores.

As described above, an aspect of the present invention provides a laminate in which an organic modifying layer with a low surface energy is introduced onto a substrate, and is covered with having a porous organic semiconductor layer.

Another aspect of the present invention addresses a laminate in which an organic intermediate layer with a low glass transition temperature is formed on an organic surface modifying layer, and is covered with a porous organic semiconductor layer having high crystallinity and large crystal grains.

According to a further aspect thereof, the present invention provides a chemical sensor using the laminate, which is superior to conventional chemical sensors in terms of electrical property, sensitivity, reliability, and efficiency.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A laminate, comprising:
   a substrate;
   an organic surface modifying layer disposed on the substrate;
   a porous organic semiconductor layer disposed on the surface modifying layer; and
   an organic intermediate layer disposed between the organic surface modifying layer and the porous organic semiconductor layer;
   wherein the organic surface modifying layer is a self-assembled monolayer (SAM).

2. The laminate of claim 1, wherein the organic surface modifying layer has a surface energy of 10 to 60 mJ m$^{-2}$.

3. The laminate of claim 1, wherein the porous organic semiconductor layer ranges in pore size from 1 to 2000 nm.

4. The laminate of claim 1, wherein the organic surface modifying layer contains any one of the compounds represented by the following Chemical Formulas 1 and 2:

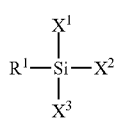

[Chemical Formula 1]

wherein,
R1 is a C3 to C30 alkyl,
X1 is a C1 to C6 alkoxy, F, Cl, Br, or I,
X2 is H, a C1 to C6 alkoxy, F, Cl, Br, or I, and
X3 is H, a C1 to C6 alkoxy, F, Cl, Br, or I; and

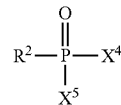

[Chemical Formula 2]

wherein,
R2 is a C3 to C30 alkyl,
X4 is H, OH, or a C1 to C6 alkoxy, and
X5 is H, OH, or a C1 to C6 alkoxy.

5. The laminate of claim 4, wherein the organic surface modifying layer contains a compound selected from the group consisting of n-octadecyltrimethoxysilane, n-octadecyltrichlorosilane, n-octyltrichlorosilane, n-octylphosphate, and n-octadecylphosphate.

6. The laminate of claim 1, wherein the organic intermediate layer contains a low-molecular weight material having a glass transition temperature ($T_g$).

7. The laminate of claim 6, wherein the glass transition temperature ranges from 0 to 300° C.

8. The laminate of claim 6, wherein the low-molecular weight material is any one of compounds represented by the Chemical Formula 3 or 4:

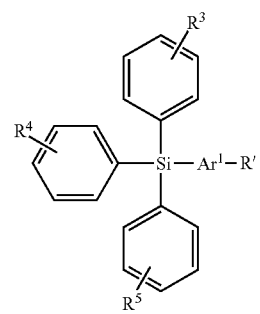

[Chemical Formula 3]

wherein,
Ar$^1$ is a C6 to C22 polycyclic aromatic hydrocarbon radical, or

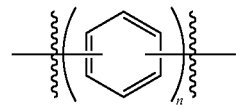

wherein n is an integer of 1 to 5,
R' is H,

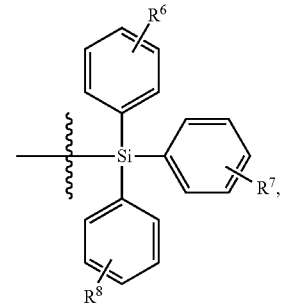

R3 to R5, which may be the same or different, are independently H or a C1 to C6 alkyl, R6 to R8, which may be the same or different, are independently H or a C1 to C6 alkyl;

[Chemical Formula 4]

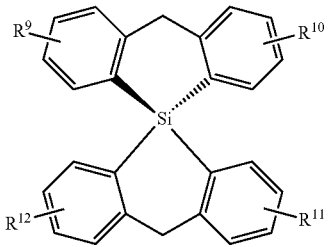

wherein,
R$^9$ to R$^{12}$, which may be the same or different, are independently a hydrogen atom or a C1 to C6 alkyl.

9. The laminate of claim 8, wherein Ar$^1$ of Chemical Formula 3 is selected from the group consisting of phenylene, naphthalenylene, anthracenylene, pyrenylenylene, tetracenylene, and pentacenylene.

10. The laminate of claim 6, wherein the low-molecular weight material is selected from the group consisting of m-bis(triphenylsilyl)benzene, o-bis(triphenylsilyl)benzene), and p-bis(triphenylsilyl)benzene.

11. The laminate of claim 1, wherein the organic semiconductor layer contains at least one selected from the group consisting of oligo-thiophene, polycyclic aromatic hydrocarbon compounds, polycyclic heteroaromatic hydrocarbon compounds, and derivatives thereof.

12. The laminate of claim 1, wherein the organic semiconductor layer contains at least one selected from among anthracene, tetracene, pentacene, hexacene, quinolone, naphthylridine, quinazoline, antradithophene, fullerene, perylenedicarboximide, naphtalene diimide, oligo-thiophene, 6,13-bis(triisopropylsilylethynyl)pentacene, 5,11-bis(triethylsilylethynyl)anthradithiophene, 2,8-difluoro-5,11-bis(triethylsilylethynyl)anthradithiophene, C60 [6,6]-phenyl-C61-butyric acid methyl ester (C60 PCBM), Cu-phthalocyanine), and Zn-phthalocyanine.

13. An electronic device, comprising the laminate of claim 1.

* * * * *